US009314824B2

(12) United States Patent
Gu et al.

(10) Patent No.: US 9,314,824 B2
(45) Date of Patent: Apr. 19, 2016

(54) POWDER AND DEPOSITION CONTROL IN THROTTLE VALVES

(71) Applicant: MKS INSTRUMENTS, INC., Andover, MA (US)

(72) Inventors: Youfan Gu, Superior, CO (US); Matthew C. Grout, Blackhawk, CO (US)

(73) Assignee: MKS Instruments, Inc., Andover, MA (US)

(*) Notice: Subject to any disclaimer, the term of this patent is extended or adjusted under 35 U.S.C. 154(b) by 175 days.

(21) Appl. No.: 14/075,163

(22) Filed: Nov. 8, 2013

(65) Prior Publication Data

US 2015/0129047 A1    May 14, 2015

(51) Int. Cl.
*B08B 9/032*    (2006.01)
*F16K 27/02*    (2006.01)
*C23C 16/44*    (2006.01)
*F16K 1/22*    (2006.01)
(Continued)

(52) U.S. Cl.
CPC ........... *B08B 9/0321* (2013.01); *C23C 16/4412* (2013.01); *F16K 1/22* (2013.01); *F16K 27/02* (2013.01); *F16K 27/0218* (2013.01); *F16K 27/0263* (2013.01); *F16K 51/02* (2013.01); *B08B 9/00* (2013.01); *Y10T 137/0419* (2015.04); *Y10T 137/4259* (2015.04)

(58) Field of Classification Search
CPC ......... F16K 25/02; F16K 1/446; F16K 27/02; F16K 1/22; F16K 27/0218; F16K 27/0264; B08B 9/023; B08B 9/027; B08B 9/032; B08B 9/0321; B08B 3/00; Y10T 137/4259
USPC ..................... 137/240, 246, 246.12
See application file for complete search history.

(56) References Cited

U.S. PATENT DOCUMENTS

| 2,315,058 | A | * | 3/1943 | Holt et al. ................... 137/242 |
| 4,911,102 | A |   | 3/1990 | Manabe et al. |
| 4,913,185 | A | * | 4/1990 | Mattei ......................... 137/241 |

(Continued)

FOREIGN PATENT DOCUMENTS

| CN | 201170335 | 12/2008 |
| JP | 54021973 | 2/1979 |

(Continued)

OTHER PUBLICATIONS

International Searching Authority, International Search Report and Written Opinion, Feb. 24, 2015, pp. 1-13, Korea.

(Continued)

*Primary Examiner* — Kevin Lee
(74) *Attorney, Agent, or Firm* — James R. Young; Cochran Freund & Young LLC (57) ABSTRACT

Powder and deposition control in a throttle valve includes nozzle inserts in the valve body that form annular plenums and annular nozzles for injecting annular flows of cleaning gas adjacent to the inside wall surface of the valve body for cleaning powders and depositions off surfaces in the valve body and off the closure member of the throttle valve. The annular flows of cleaning gas can be in intermittent, periodic, or in pulsed bursts or at a steady-state flow rates to dislodge powder particles stuck to the inside surface of the throttle valve, to etch or reactively clean solid deposits, or to prevent or minimize build-up of powder particles or solid deposits in the throttle valve.

35 Claims, 7 Drawing Sheets

(51) Int. Cl.
*F16K 51/02* (2006.01)
*B08B 9/00* (2006.01)

(56) References Cited

U.S. PATENT DOCUMENTS

| | | | |
|---|---|---|---|
| 5,085,244 A * | 2/1992 | Funk | 137/240 |
| 5,160,543 A | 11/1992 | Ishihara et al. | |
| 5,722,802 A | 3/1998 | March | |
| 5,827,370 A | 10/1998 | Gu | |
| 5,842,683 A * | 12/1998 | Wei | 251/315.13 |
| 6,056,003 A * | 5/2000 | Madsen et al. | 137/240 |
| 6,090,206 A | 7/2000 | Bang et al. | |
| 6,578,598 B2 * | 6/2003 | Gardner | 137/240 |
| 6,832,621 B1 * | 12/2004 | Williams | 137/239 |
| 7,182,095 B2 * | 2/2007 | Weinhold | 137/240 |
| 7,306,007 B2 * | 12/2007 | Matsumoto | 137/614.06 |
| 8,375,977 B2 * | 2/2013 | Jones | 137/240 |
| 2005/0173066 A1 | 8/2005 | Sugano | |

FOREIGN PATENT DOCUMENTS

| | | |
|---|---|---|
| JP | 63128719 | 6/1988 |
| JP | 1-286306 | 11/1989 |
| JP | 4010617 | 1/1992 |
| JP | 6216041 | 8/1994 |
| JP | 7122503 | 5/1995 |
| JP | 08-218174 | 8/1996 |
| JP | 09-178039 | 7/1997 |
| JP | 10177278 | 6/1998 |
| JP | 2003-254675 | 9/2003 |

OTHER PUBLICATIONS

Brodsky et al.; Method of Preparing Hydrogenated Amorphous Silicon; IBM Technical Disclosure Bulletin; vol. 22, No. 8A; pp. 3391-3392; Jan. 1980.
Dusinberre, Gas Turbine Power; p. 158, 1952.
Giampaolo; The Gas Turbine handbook; Principles and Practices; pp. 35-39; 1997.

* cited by examiner

POWDER AND DEPOSITION CONTROL IN THROTTLE VALVES

BACKGROUND

1. Technical Field of the Invention

The present invention is related to methods and apparatus for handling flows of exhaust gases from reaction chambers, and more particularly exhaust gases that are laden with powder particles and that include condensable components.

2. State of the Prior Art

Many industrial processes form solid, powdery, by-products and, at the same time, involve flowing and controlling flows of effluents of the processes. For example, in a variety of chemical vapor deposition (CVD) processes, gaseous chemicals/precursors are fed into vacuum reaction chambers, where they are reacted to deposit solid films or coatings of compounds or elemental materials onto substrates. Some of such CVD processes produce solid powdery by-products, and exhausts of such powdery by-products can be problematic in exhaust pipes (often called vacuum pumping lines and sometimes called forelines in vacuum CVD systems), valves, vacuum pumps, and other flow handling components and equipment downstream from the reaction chambers, particularly when the vacuum in the process chamber is relatively low, i.e., the process pressure is relatively high, for CVD processes (e.g., in the 10 to 800 torr range), where gas phase reactions are dominant because of a short mean free path between gas molecules. Other deposition processes may exhaust unreacted gases from deposition chambers that then react downstream to form solid or liquid build-ups the in vacuum pumping lines, valves, pumps, and other components or equipment.

A variety of methods and equipment have been developed to prevent or at least minimize such solid build-up in downstream exhaust components from condensation or chemical reactions, which have been effective to various degrees. For example, pipe heaters, such as those shown and described in U.S. Pat. No. 5,714,738, issued Feb. 3, 1998, can be used to maintain higher temperatures in vacuum pumping lines and other pipes to prevent or minimize condensation. Such heaters in special forms can be used to heat at least portions of valves, vacuum pumping line, and other equipment, as shown, for example, on a an isolation valve in U.S. Pat. No. 8,196,893, issued Jun. 12, 2012. Nozzle assemblies, such as the assembly shown and described in U.S. Pat. No. 5,827,370, issued Oct. 27, 1998, can be used to create a laminar flow of inert or non-reactive gas along the inner surface of a vacuum pumping line or other pipe to prevent surface reactions of gaseous chemicals from forming solid build-ups on the inner surface of the pipe. Various traps, reactors, filters, and other equipment have been developed for removing such condensable or reactive gases from exhaust flows, for example, U.S. Pat. No. 5,820,641, issued Oct. 13, 1998, U.S. Pat. No. 6,197,119, issued Mar. 6, 2001, U.S. Pat. No. 6,488,745, issued Dec. 3, 2002, and U.S. Pat. No. 7,455,720, issued Nov. 25, 2008, The foregoing examples of the related art and limitations related therewith are intended to be illustrative and not exclusive. Other limitations of the related art and other examples of related art will become apparent to those of skill in the art upon a reading of the specification and a study of the drawings.

SUMMARY

The following embodiments and aspects thereof are described and illustrated in conjunction with systems, tools and methods which are meant to be examples and illustrative, not limiting in scope. In various embodiments and implementations, one or more of the above-described problems have been reduced or eliminated, while other embodiments are directed to other improvements and benefits.

Valve apparatus of a type that has a valve body with a flow channel defined by an inside wall surface of the valve body between an inlet port and an outlet port of the valve body and a closure member in the flow channel an annular orifice for directing an annular flow of cleaning gas along the inside wall surface toward the closure member. In one embodiment, two annular orifices direct two annular flows of cleaning gas in opposite directions from opposite sides of the closure member toward each other along the inside wall surface. In another example embodiment such valve apparatus may also include an upstream annular nozzle positioned adjacent to the inside wall surface upstream from the closure member and directed along the inside wall surface toward the closure member and a downstream annular nozzle positioned adjacent to the inside wall surface downstream from the closure member and directed along the inside wall surface toward the closure member. In another example embodiment such a valve apparatus may also include an upstream annular plenum for distributing a first portion of the cleaning gas to the upstream annular nozzle and a downstream annular plenum for distributing a second portion of the cleaning gas to the downstream annular nozzle. In another example embodiment, such a valve apparatus may include an upstream annular nozzle extending between the upstream annular plenum to the upstream annular orifice for flowing the first portion of the cleaning gas from the upstream annular plenum to the upstream annular orifice and a downstream annular nozzle extending between the downstream annular plenum to the downstream annular nozzle for flowing the second portion of the cleaning gas from the downstream annular plenum to the downstream annular orifice. In another example embodiment, the upstream annular nozzle may have a cross-sectional area that is sized to produce a choked flow condition and the downstream annular nozzle may have a cross-sectional area that is sized to produce a choked flow condition.

A method of controlling powder or solid deposition in a valve that has a valve body with a flow channel defined by an inside wall surface of the valve body between an inlet port and an outlet port of the valve body, and a closure member in the flow channel may include directing at least one annular flow of cleaning gas along the inside wall surface toward the closure member. In one example method, controlling powder or solid deposition in such a valve may include directing two annular flows of cleaning gas in opposite directions from opposite sides of the closure member toward each other along the inside wall surface. In another example embodiment, a method may include directing one two annular flows of cleaning gas into the flow chamber by flowing the cleaning gas through at least one annular nozzle positioned adjacent to the inside wall surface either upstream from the closure member or downstream from the closure member or both and directed along the inside wall surface toward the closure member. Another embodiment may include producing a choked flow condition in at least one annular nozzle. An example of such cleaning gas flow into the flow chamber and be intermittent, periodic, steady-state, or any other flow timing or characteristic desired. The cleaning gas can be non-reactive or reactive.

In addition to the example aspects, embodiments, and implementations described above, further aspects, embodiments, and implementations will become apparent to persons skilled in the art after becoming familiar with the drawings and study of the following descriptions.

BRIEF DESCRIPTION OF THE DRAWINGS

The accompanying drawings, which are incorporated herein and form a part of the specification, illustrate some, but not the only or exclusive, example embodiments and/or features. It is intended that the embodiments and figures disclosed herein are to be considered illustrative rather than limiting.

In the drawings.

DETAILED DESCRIPTIONS OF EXAMPLE EMBODIMENTS

Figure 1:
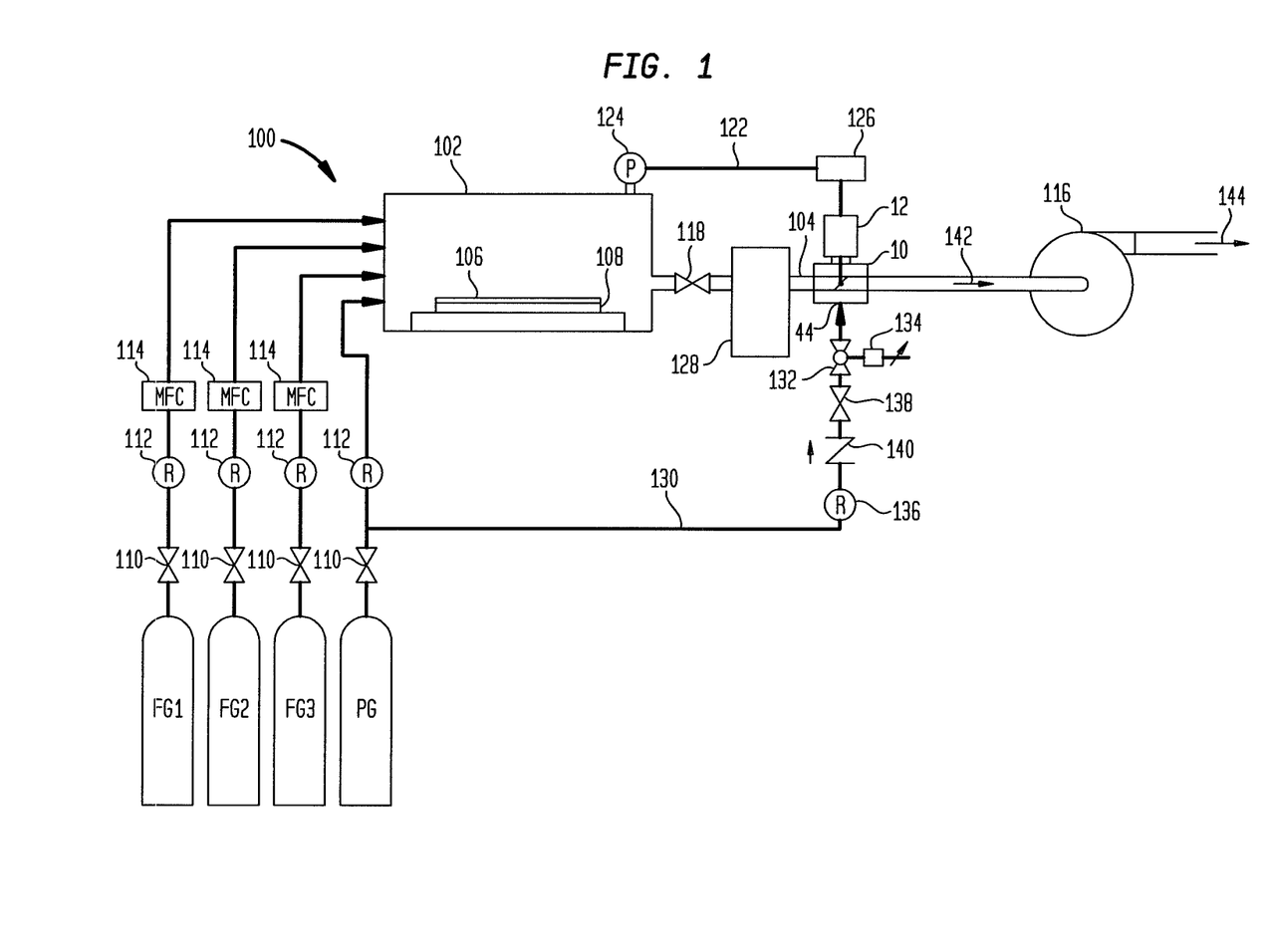
FIG. 1 is a schematic flow diagram illustrating an example application of the powder and deposition control feature for a throttle valve in a chemical vapor deposition system.

An example chemical vapor deposition (CVD) system 100 is illustrated diagrammatically in FIG. 1 with a powder control feature that abates powder build-up in and interference with the throttle valve 10 in the vacuum pumping line 104 of the CVD system 100. The components, functional features, and operation of the example CVD system 100 will be described in more detail below, but with the understanding that these descriptions and the accompanying drawings used to illustrate the descriptions are intended to be examples, not limitations, of the invention. Accordingly, and with no intent to limit or circumscribe the invention, such a CVD system 100 may include a reaction chamber 102 in which reaction gases, sometimes called feed gases, react in a manner that results in a deposition of a desired thin film 106 on a substrate 108 positioned in the reaction chamber 102. The reaction gases, sometimes called feed gases, may be flowed from containers of such gases, e.g., containers FG1, FG2, or FG3, into the reaction chamber 102 concurrently or in sequence, depending on the particular thin film 106 product desired and the particular CVD process used. In some processes, an inert carrier gas for dilution of the reaction gases or an inert purge gas for purging reaction gases out of the reaction chamber 102 at the end of a cycle may be flowed from a container, e.g., container PG, through the reaction chamber 102. Appropriate shut-off valves 110 and pressure regulators 112 may be provided for such containers, and mass flow controllers 114 may be used to control flow rates, especially for the feed gases, for quality control of the reaction process. While not essential for all CVD processes, it is typical to evacuate the reaction chamber 102 of air, water vapor, and other potential contaminants and to maintain such vacuum during the CVD deposition process to maintain purity of the reactions and of the resulting thin film 106 product. A vacuum pump 116 connected to the reaction chamber 102 by a pipe 104, sometimes called a vacuum pumping line, operates during the CVD process to maintain the vacuum in the reaction chamber 102 and for as long as it is desired to keep the reaction chamber 102, vacuum pumping line 104, and other components free of air, water, and other contaminants. Generally, in commercial production CVD systems, the vacuum is maintained as long as possible, because contamination has costly adverse consequences and because it takes a long time to re-evacuate the CVD system, during which time production of products cannot proceed.

The gaseous byproducts of the reactions in the reaction chamber 102 are drawn by the vacuum pump 116 out of the reaction chamber 102 via the vacuum pumping line 104. A throttle valve 10 in the vacuum pumping line 104 opens and closes to whatever extent is necessary to maintain the pressure in the reaction chamber 102 in a desired vacuum range for the particular CVD process being run. A feedback system 122 between a pressure transducer 124 and a motor control 126 connected to the motor drive 12 of the throttle valve 10 facilitates automatic control of the throttle valve 10 setting to maintain the desired pressure in the reaction chamber 102. Such feedback systems are well-known in the art and need not be described in more detail here. Some CVD processes are plagued by solid powder particles in the vacuum pumping line 104, which can clog and interfere with the operation of components, including the throttle valves, even if a powder trap or filter 128 is provided in the vacuum pumping line 104 in front of the throttle valve, because the throttle valve opening may be very small in order to maintain a particular desired pressure P in the reaction chamber 102. However, the throttle valve 10 in this example is configured and equipped with powder control features to control and abate such clogging and interference with the operation of the throttle valve 10, as will be described in more detail below.

As an example, and not for limitation, the powder control system for the throttle valve 10 is described in a CVD system 100 that is notorious for producing solid particulate powder by-products that clog and interfere with throttle valves, especially when the CVD process chamber vacuum is relatively low, i.e., pressure is relatively high. A metal organic chemical vapor deposition (MOCVD) process used to deposit a thin film 106 of gallium nitride (GaN) on a substrate 108 may include reacting trimethylgallium ("TMG", $Ga(CH_3)_3$) with ammonia ($NH_3$) and a large amount of hydrogen in a vacuum at a high temperature. TMG and ammonia can react with each other to form an intermediate adduct, $Ga(CH_3)_3.NH_3$, very quickly, even at ambient temperature. The crystalline compound of GaN is formed by the dissociation of the intermediate adduct on the wafer surface which is heated at a temperature around 1,000 to 1,200° C. The relatively slow dissociation process enables the formation of high quality crystalline GaN with a nearly perfect arrangement of the GaN atoms; however, the dissociation of the intermediate adduct leads to the generation of carbon powders and liquid gallium. Due to the existence of liquid gallium (Ga) inside the reaction chamber (gallium stays in liquid form from 30 to 2,200° C.), in addition to the carbon powders formed due to decomposition of $Ga(CH_3)_3.NH_3$ adduct, partially gallium filled carbon nanotube particles could be formed inside the process chamber, especially on slightly cooler reaction chamber inner walls, because the liquid gallium acts as a catalyst which assists the formation of carbon nanotubes under liquid droplets. Such powder particles are drawn out of the reaction chamber 102 and into the vacuum pumping line 104 by the vacuum pump 116 along with other exhaust gases.

Further, the higher the process chamber pressure P, the shorter the mean free path between gas molecules in the process chamber 102, which increases probability of gas molecule collisions, thus favors gas phase reactions as compared to surface reactions. Therefore, gas phase chemical reactions are usually dominant when process chamber pressures P are relatively high, e.g., 10 to 800 torr. Gas phase reactions tend to produce more powdery solid by-products than surface reactions, so relatively high process chamber pressures P tend to generate more powdery solid by-products than higher vacuum, lower pressure processes. All of these complex parasitic reactions generate a significant amount of by-products inside the process chamber and results in accumulation of powder along the vacuum pumping line. At the same time, the throttle valve 10 is typically operated with very small valve opening settings in the throttle mode in order to get the required throttled gas flow effect to maintain a desired chamber pressure. Such small throttle valve openings are particularly susceptible to powder interference and clogging, and the accelerated gas flow through such very small valve openings creates significant turbulence and dramatic gas cooling effects. The combined effects of such gas flow turbulence and cooling often leads to even more severe accumulation of powder in and around the throttle valve 10, especially downstream of the throttle valve. For the example GaN MOCVD, the condensable liquid gallium by-products in the effluent will bind solid carbon powder particles together, making them more sticky to each other and causing them to accumulate on the throttle valve surfaces as well as in the vacuum pumping line 104, especially immediately after the throttle valve 10, where gas temperature is lower and severe turbulence enhances the probability of particle collision and adhesion.

As mentioned above, it is typical to provide a filter 128 in the vacuum pumping line 104 upstream from the throttle valve 10 to trap powder before they reach the throttle valve 10 in order to prevent the throttle valve from clogging. However, because of the relatively high gas temperature (high process temperatures), high gas flow rates, and small sizes of powder particles generated in such example MOCVD processes, significant amounts of powder still get through such filters, even with filter media pore sizes as small as 1-4 microns.

The example throttle valve 10 is shown diagrammatically in FIGS. 2-7 is equipped with powder control features, including, but not limited to annular nozzles 52, 152 (best seen in FIGS. 5 and 6) adjacent to the inside wall surface 31 that forms the fluid flow channel 30 in the valve 10. The components, functional features, and operation of the example throttle valve 10 with the powder control features will be described in more detail below, particularly in reference to the cross-section views in FIGS. 5 and 6, but with the understanding that these drawings and descriptions are intended to be examples, not limitations, of the invention. The example throttle valve 10 is of a type that is commonly called a butterfly valve with a throttling closure member 14 (sometimes called "closure member" for short) in the form of a disk (sometimes called a flapper) mounted in the fluid flow channel 30 on a valve shaft 16 (sometimes called a butterfly shaft), which rotates in the valve body 32 about an axis 17 that is generally transverse to the longitudinal axis 18 of the flow channel 30. However, other types of valves with other kinds of closure members can be used.

Figure 2:
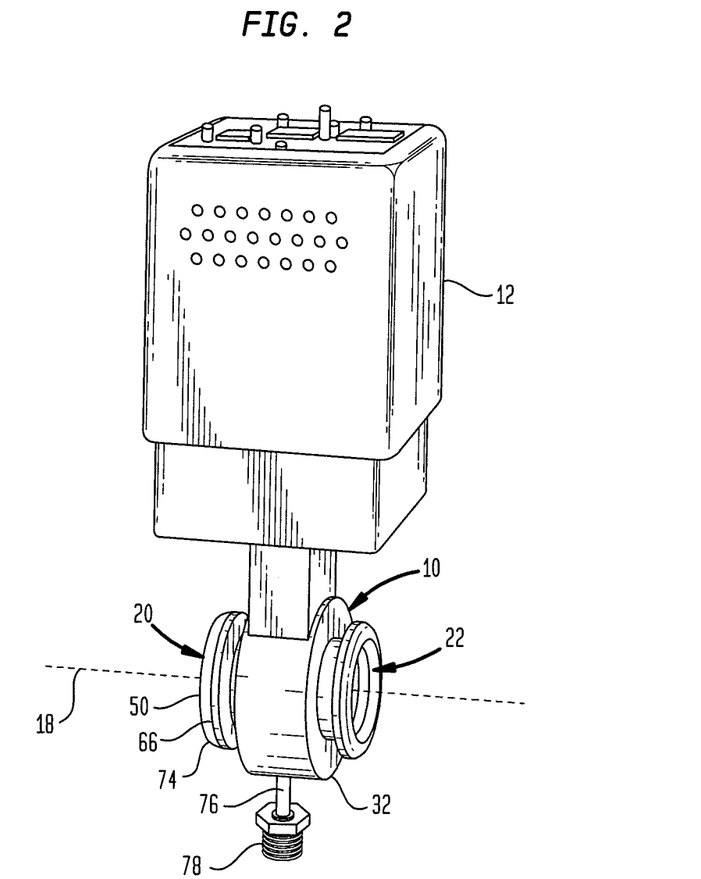
FIG. 2 is an isometric view of an example butterfly-type throttle valve configured for powder control.
Figure 3:
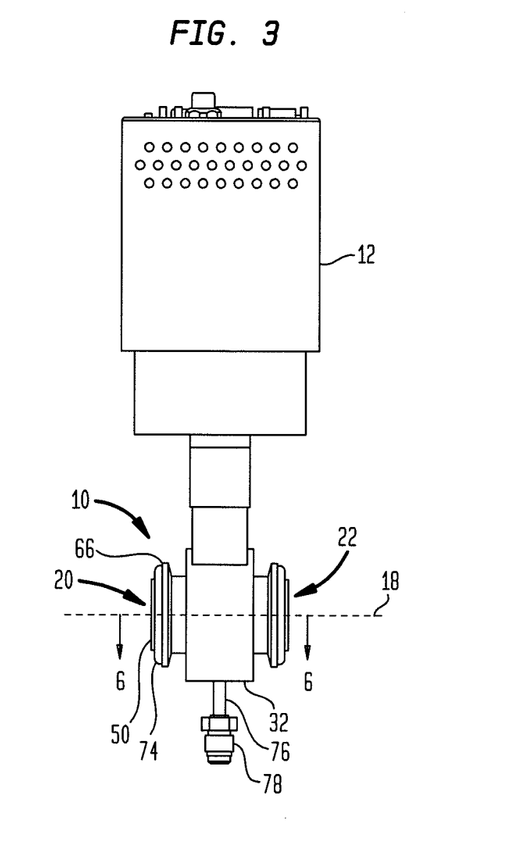
FIG. 3 is front elevation view of the example throttle valve in FIG. 2.
Figure 4:
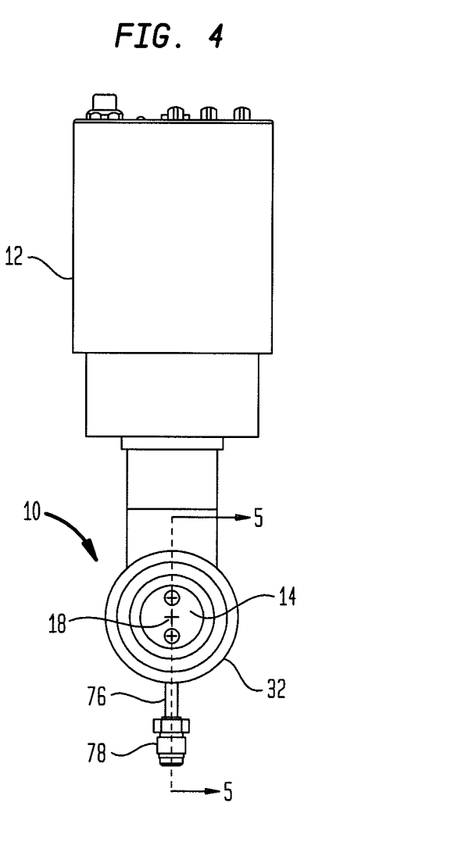
FIG. 4 is side elevation view of the example throttle valve of FIG. 2.
Figure 5:
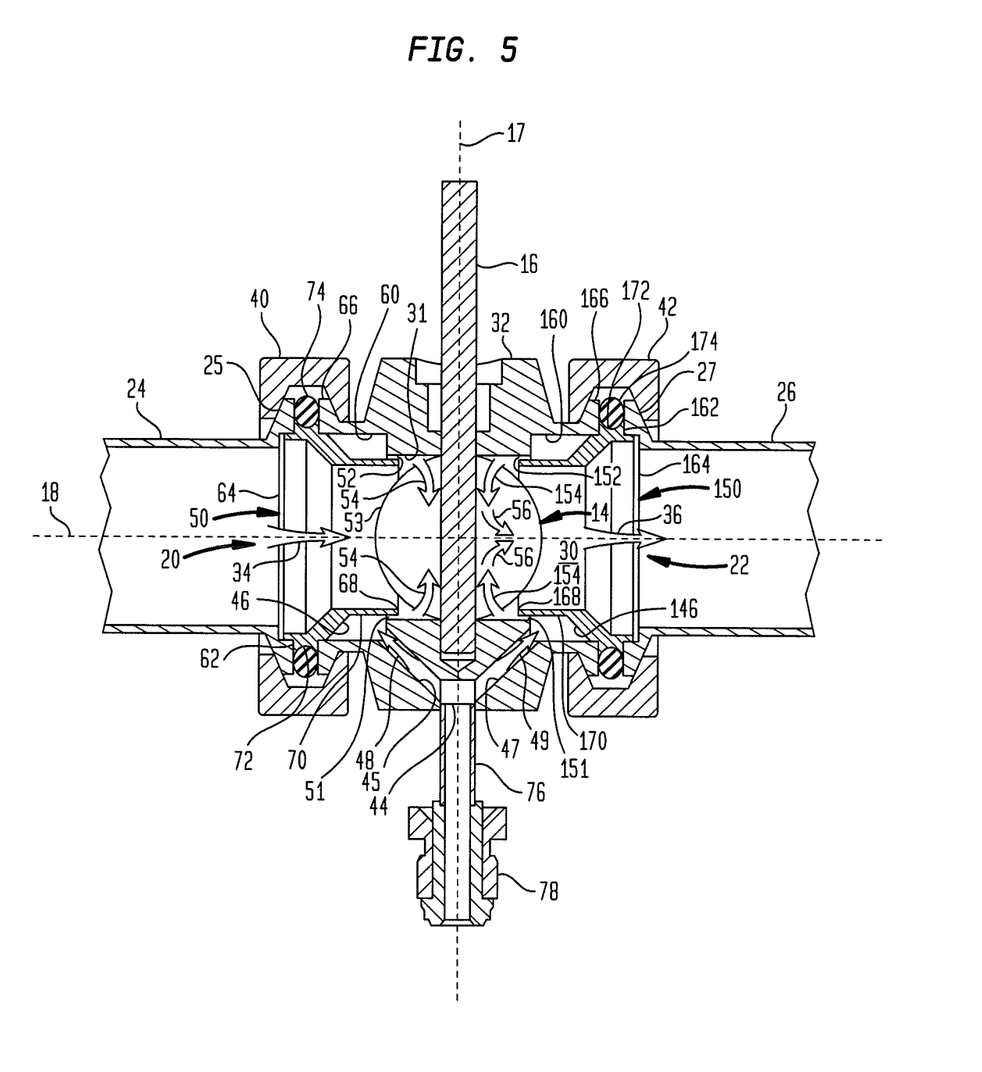
FIG. 5 is an enlarged cross-sectional view of the example throttle valve in FIG. 2 taken along section line 5-5 of FIG. 4.
Figure 6:
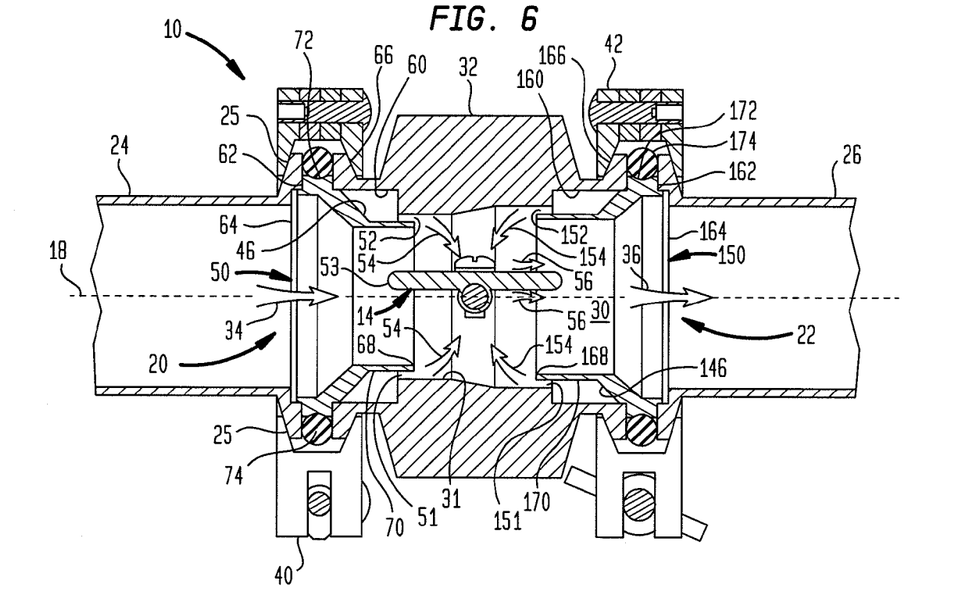
FIG. 6 is an enlarged cross-sectional view of the example throttle valve in FIG. 2 taken along section line 6-6 of FIG. 3.

The example throttle valve 10 is illustrated generally in FIGS. 2-4 equipped with a conventional motor actuator 12 for adjusting the throttle position of the example butterfly closure components (e.g., closure member 14 mounted on the rotatable butterfly shaft 16 best seen in FIGS. 5 and 6) at any desired setting between the fully opened position (as shown in FIGS. 5 and 6) and the fully closed position (as shown in FIG. 4). The motor actuator 12 is shown in FIGS. 2-4 primarily to illustrate the throttle valve 10 in a typical assembly for automated use, for example, to control the pressure P in the reaction chamber 102 as explained above, but the motor actuator 12 is not essential to the invention. The throttle valve 10 could be operated manually, pneumatically, or in any other convenient manner. The motor actuator 12 is not shown in FIGS. 5-8.

Generally, the example throttle valve 10 illustrated in the FIGS. 2-6 has an inlet port 20 and an outlet port 22, so fluids can flow generally along the longitudinal axis 18 through the flow channel 30 in the valve body 32, as indicated by the flow arrows 34, 36 in FIGS. 5 and 6. Of course, persons skilled in the art will understand that fluids could also be flowed through the flow channel 30 in the opposite direction. Sections of a conventional inlet pipe 24 with a flange connector 25 and of a convention outlet pipe 26 with a flange connector 27 are illustrated in FIGS. 5 and 6 connected by the respective conventional flange clamps 40, 42 to the valve body 32. The inlet pipe 24 and the outlet pipe 26 conduct the fluids into and out of the throttle valve 10 and may be components of the vacuum pumping line 104 in the example MOCVD system 100 in FIG. 1.

As best seen in FIG. 5, an auxiliary port 44 in the valve body 32 conducts a cleaning gas, which may be an inert or other non-reactive gas in some applications or a reactive or etch gas in other applications, to branch ducts 45, 47, through which the cleaning fluid is directed to respective upstream and downstream plenums 46, 146. A first portion of the cleaning fluid flows through the branch duct 45, as indicated by the flow arrow 48, into the upstream annular plenum 46, which distributes the cleaning gas around the outside surface of the upstream nozzle insert 50 for injection through the upstream annular orifice 52 into the flow channel 30. A second portion of the cleaning fluid flows through the branch duct 47, as indicated by the flow arrow 49, into the downstream annular plenum 146, which distributes the cleaning gas the outside surface of the downstream nozzle insert 150 for injection through the downstream annular orifice 152 into the flow channel 30. In this context, the terms upstream and downstream are used in relation to the direction of flow arrows 34, 36 in FIGS. 5 and 6 for convenience. Accordingly, in this context, the upstream nozzle insert 50 is in the upstream (inlet) port 20, which is upstream in relation to the downstream nozzle insert 150 in the downstream (outlet) port 22 and is upstream in relation to the valve closure member 14. Similarly, mutatis mutandis, the downstream nozzle insert 150 is in the downstream (outlet) port 22, which is downstream in relation to the upstream nozzle insert 50 and is downstream in relation to the valve closure member 14. Each of the annular orifices 52, 152 faces toward the closure member 14 in a manner that directs an annular flow of the cleaning gas (as indicated by the respective flow arrows 54, 154) into the flow channel 30 along the inside wall surface 31 of the valve body 32.

During a normal CVD process of depositing a thin film 106 in a reaction chamber 102 (FIG. 1), the cleaning gas is turned off, e.g., by closing the cleaning gas supply valve 132, so there is no impact or interference of the cleaning gas on the CVD process or on the productivity of the reaction chamber 102. The cleaning process with the cleaning gas in the throttle valve 10 can be relatively infrequent, for example, from once per day to once per week, depending on the cleanliness of the throttle valve 10 in a particular CVD process, and it may be very short, for example, less than two minutes, although longer times may also be used if desired. Therefore, the cleaning process in the throttle valve 10 can be executed while the reaction chamber 102 is idle, for example, while a wafer 108 is being changed. Therefore, cleaning the throttle valve 10 with the cleaning gas process as described herein has no impact on the productivity up-time of the CVD system 100 in general or the reaction chamber 102 in particular. Also, the isolation valve 118 upstream of the throttle valve 10 can be closed during the cleaning process, which allows the use of a high pressure cleaning gas jet in the throttle valve 10 from the annular nozzles 51, 151 (FIGS. 5-7) to dislodge powder particle deposits on the closure member 14 and inside wall surface 31 of the throttle valve 10 without causing blow-back of powder particles upstream and into the reaction chamber 102 (FIG. 1) or otherwise affecting the CVD process. During the cleaning process, the annular flow of cleaning gas into the throttle valve 10 and through the nozzles 51, 151 (FIGS. 5-7) can be steady flow or intermittent bursts of the cleaning gas, and it can be either turbulent or laminar flow, as explained in more detail below.

Figure 7:
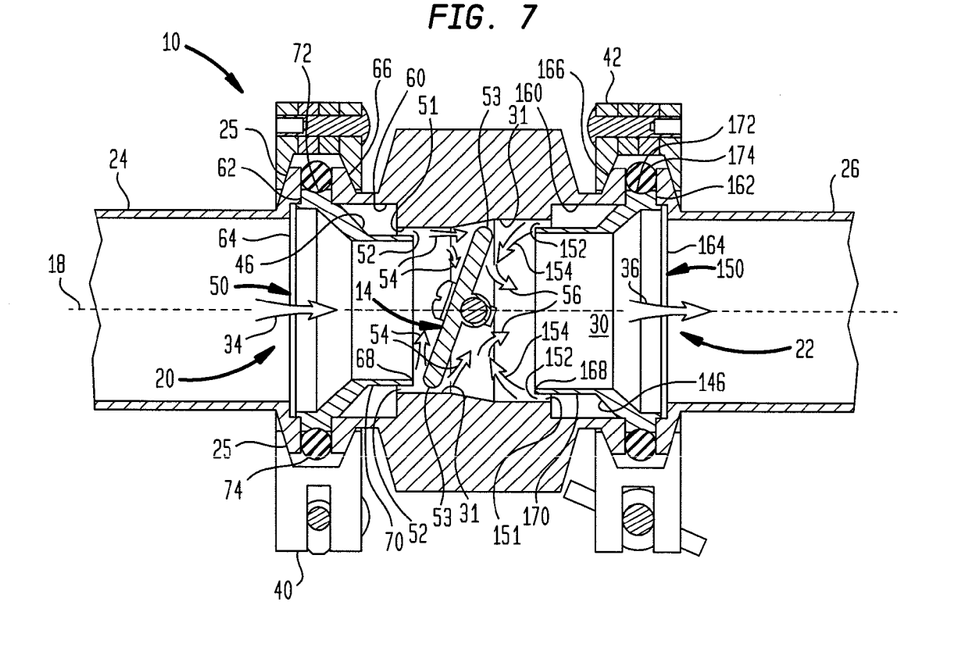
FIG. 7 is an enlarged cross-sectional view of the example throttle valve similar to FIG. 6, but illustrating the valve closure member in an example nearly closed, throttling mode.

In general, the respective annular bursts or purge flows of cleaning gas from the annular orifices 52, 152 into the flow chamber 30 are directed toward each other, as illustrated by the flow arrows 54, 154 in FIGS. 5 and 6, but those oppositely directed flows 54, 154 toward each other increase localized pressure where they meet, which causes them to redirect radially inward toward the longitudinal axis 18 where localized pressures are lower, as also illustrated by the flow arrows 54, 154. That flow 54, 154 is generally along the respective opposite faces of the valve closure member 14, which tends to dislodge and purge away powder particles that may have adhered to the closure member 14. Those powder particles are then drawn along with the bursts or purge flows 56 out of the outlet port 22 along with the gas flow 36. When the closure member 14 is rotated to a nearly closed mode, for example as illustrated in FIG. 7, in which the closure member 14 is throttling the flow 34, 36 of gas through the throttle valve 30, the annular bursts or purge flows 54, 154 from the annular orifices 52, 152 are directed at the peripheral edge 53 of the closure member 14 and at the portion of the inside wall surface 31 adjacent to the peripheral edge 53, which blows away powder particles that may be accumulated at the peripheral edge 53 or on the adjacent inside wall surface 31 of the valve body 32 both upstream and downstream from the peripheral edge 53. This cleaning process can be enhanced by moving the closure member 14 back and forth between the opened and closed positions in the throttle valve 10 while the cleaning gas is being flowed through the nozzles 51, 151 into the flow chamber 30, which not only helps to dislodge the powders stuck on the closure member 14, but also allows the vacuum pump 116 (FIG. 1) to move the dislodged powder particles downstream.

Referring now primarily to FIGS. 5-8, the annular plenum 46 in the example throttle valve 10 is provided by a combination of an annular channel 60 extending into the inlet end 20 of the housing 32 and the nozzle insert 50 positioned adjacent to and concentric with the annular channel 60. An annular rim flange 62, which extends radially outward around the circumference of the flared inlet end section 64 of the nozzle insert 50, abuts the connection flange 66 of the valve body 32 adjacent to the channel 60 when the nozzle insert 50 is inserted into the inlet end 20 of the valve body 32. With the nozzle insert 50 in that position, the outlet end 68 of a cylindrical extension 70 of the nozzle insert 50 extends past the channel 60 toward the closure member 16. The cylindrical extension 70 is small enough in diameter to be spaced a radial distance inwardly from the inside wall surface 31 of the valve body 32, thus forming a narrow annular nozzle 51 between the extension 70 and the inside surface 31 through which the cleaning gas flows from the annular plenum 46 to the annular orifice 52. The annular nozzle 51 and annular orifice 52 are structured and oriented to inject the cleaning gas into the flow path 30 along the inside wall surface 31 of the valve body 32 in an annular jet flow of the cleaning gas that at least initially is generally parallel to and concentric with the longitudinal axis 18 of the flow channel 30. The rim flange 62 (best seen in FIG. 8) has an annular groove 72 around its peripheral surface to receive and retain a seal 74, e.g., an O-ring seal as illustrated in FIGS. 5-7 and 9, which is squeezed between the connecting flange 66 of the valve body 32 and the connecting flange 25 of the inlet pipe 24, when the inlet pipe 24 is connected to the valve body 32 with the clamp 40 as shown in FIGS. 5 and 6. Other fastening mechanisms or techniques, for example, threaded surfaces (not shown) could be provided to fasten the nozzle insert 50 in the valve body 32, as would be understood by persons skilled in the art once they understand the structures, principles, and advantages of this throttle valve structure. A suitable tube 76 and/or tube fitting 78 are provided to connect the auxiliary duct 44 to a suitable source of cleaning gas.

Figure 8:
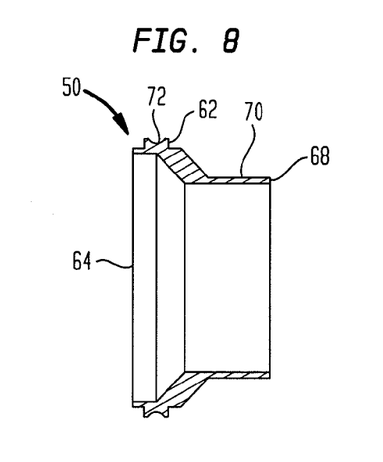
FIG. 8 is a further enlarged cross-sectional view of the nozzle insert component of the example throttle valve in FIGS. 2-6.
Figure 9:
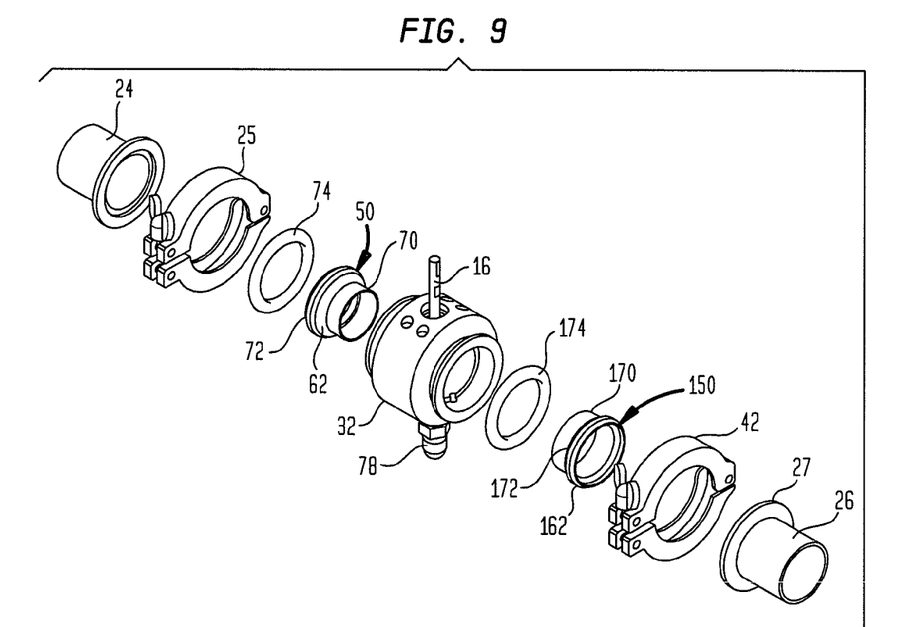
FIG. 9 is an exploded view of the components of the example throttle valve in FIGS. 2-7.

Similarly, the annular plenum 146 in the example throttle valve 10 is provided by a combination of an annular channel 160 extending into the outlet end of the housing 32 and the nozzle insert 150 positioned adjacent to and concentric with the channel 160. An annular rim flange 162, which extends radially outward around the circumference of the flared inlet end section 164 of the nozzle insert 150, abuts the connection flange 166 of the valve body 32 adjacent to the channel 160 when the nozzle insert 150 is inserted into the outlet end 22 of the valve body 32. The downstream nozzle 150 is similar to the upstream nozzle 50 shown in FIG. 8, although the size may be different, depending on the profile of the inside wall surface 31 and downstream outlet 22 size as illustrated in FIGS. 5 and 6. With the nozzle insert 150 in that position, the outlet end 168 of a cylindrical extension 170 of the nozzle insert 150 extends past the channel 160 toward the closure member 16. The cylindrical extension 170 is small enough in diameter to be spaced a radial distance inwardly from the inside wall surface 31 of the valve body 32, thus forming an annular nozzle 151 between the extension 170 and the inside surface 31 through which the cleaning gas flows from the annular plenum 146 to the annular orifice 152. The annular nozzle 151 and annular orifice 152 are structured and oriented to inject the cleaning gas into the flow path 30 along the inside wall surface 31 of the valve body 32 as explained above. The rim flange 162 has an annular groove 172 around its peripheral surface to receive and retain a seal 174, e.g., an O-ring seal as illustrated in FIGS. 5, 6, and 8, which is squeezed between the connecting flange 166 of the valve body 32 and the connecting flange 27 of the outlet pipe 26, when the outlet pipe 26 is connected to the valve body 32 with the clamp 42 as shown in FIGS. 5 and 6. Again, other fastening mechanisms or techniques, for example, threaded surfaces (not shown) could be provided to fasten the nozzle insert 150 in the valve body 32, as would be understood by persons skilled in the art once they understand the structures, principles, and advantages of this throttle valve structure.

In the example CVD system 100 shown in FIG. 1, the auxiliary duct 44 in the throttle valve 10 is connected via a supply pipe 130 to the purge gas source container PG, which, in the case of the example MOCVD system for depositing GaN, may be nitrogen ($N_2$) gas, although it could be connected to any other container or supply of cleaning gas. In one example implementation, a suitable cleaning gas supply valve 132 can be provided in the supply pipe upstream from the throttle valve 10 to control cleaning gas flow into the throttle valve 10. For example, but not for limitation, the cleaning gas flow may be controlled by a cleaning gas supply valve 132 to flow into the throttle valve 10 intermittently, periodically, or steady-state. The cleaning gas may also be controlled to flow at a single desired flow rate into the throttle valve 10 or at a variable flow rate. Suitable valves for use as the gas supply valve 132 for those any other characteristics and functions are available commercially and known to persons skilled in the art. For example, but not for limitation, for an intermittent or periodic pulsed flow of cleaning gas into the throttle valve, the cleaning supply gas valve 132 may include an isolation valve, which can be switched rapidly and robustly between full on and full off (flow, no flow) modes. In this example implementation, the cleaning gas may be pulsed in timed intervals and for timed durations into the throttle valve to produce pulsed bursts of the cleaning gas out of the annular orifices 52, 152 to break loose and blow out powder particles that may be sticking to the inside surface 31 of the valve body 32 or to the closure member 14. Alternatively, such an isolation valve can be controlled to supply the cleaning gas to the throttle valve 10 intermittently when desired or at steady-state flows. Such isolation valves are well-known to persons skilled in the art, and such persons skilled in the art also understand how to control turning such valves on and off for intermittent, periodic, or steady-state flow. For example, an electric solenoid control valve 134 can be used to operate a pneumatic-actuated valve 132 in a manner that provides the desired flow of the cleaning gas into the throttle valve 10 for desired flow and non-flow durations and intervals. Such solenoid control valves and pneumatically actuated isolation valves are well-known and readily available commercially. For another example, the isolation valve 132 could be electrically actuated with an electric solenoid, which is also well-known-known to persons skilled in the art.

Figure 10:
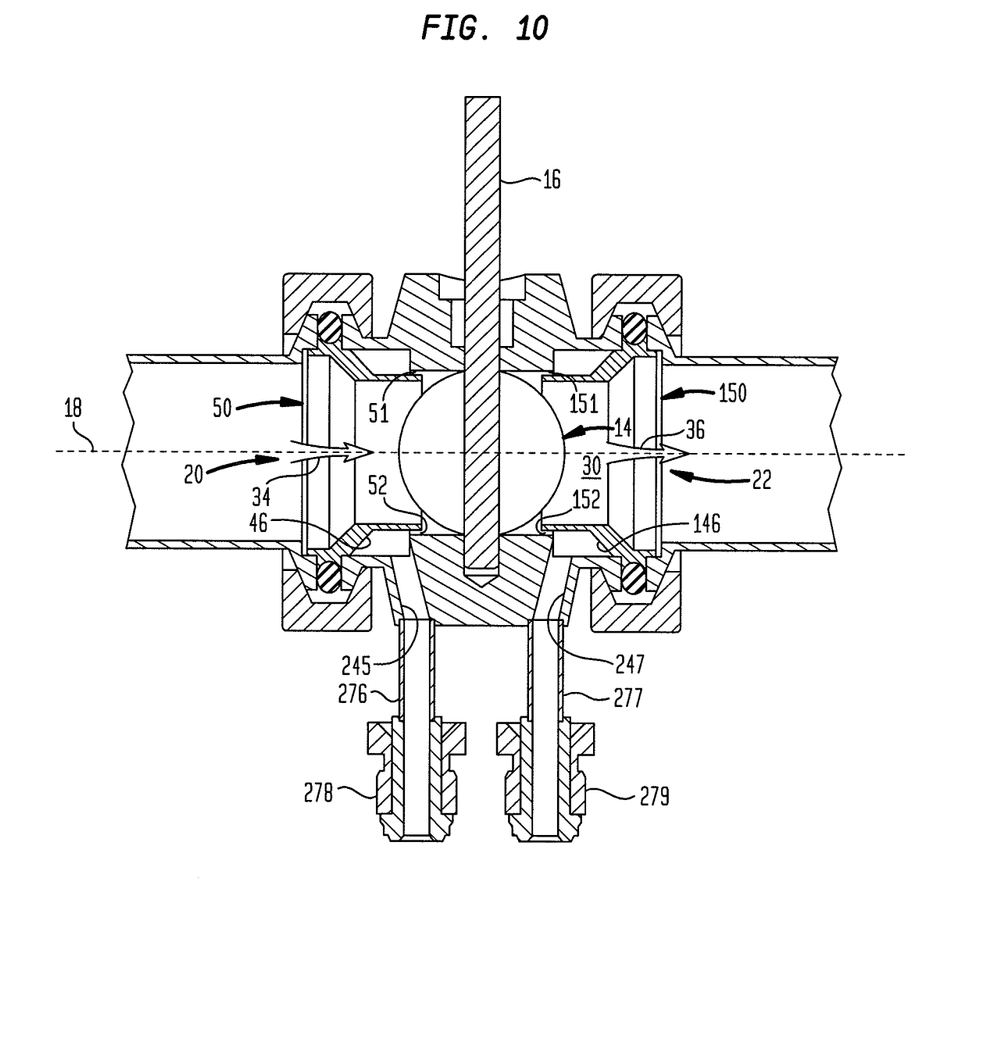
FIG. 10 is an enlarged cross-sectional view similar to FIG. 5, but of another example throttle valve configured for deposition and powder control.

If it is desired to provide flows of cleaning gas from the upstream and downstream annular orifices 52, 152 independently from each other, e.g., at different times, for different durations, or at different mass flow rates, the respective upstream and downstream annular orifices 52, 152 can be supplied with cleaning gas (or different cleaning gases) through separate ducts, as illustrated in the example throttle valve 210 embodiment in FIG. 10. The example throttle valve 210 in FIG. 10 is much the same as the example throttle valve 10 described above in FIGS. 2-9, so components and features of the example throttle valve 210 that are the same as components and features of the example valve 10 are described with the same part numbers. However, the example throttle valve 210 in FIG. 10 has separate ducts 245, 247 for conducting cleaning gas separately into the respective annular plenums 46, 146. Separate tubes 276, 277 and tube fittings 278, 279 connected respectively to the two separate ducts 245, 247 can be used to connect the respective separate ducts 245, 247 to separate cleaning gas supply valves (not shown) for supplying clean gas separately and independently to the respective annular plenums 46, 146. Therefore, a clean gas can be flowed from the upstream annular plenum 46 and through the upstream annular orifice 52 into the throttle valve flow channel 30 in one manner, e.g., intermittently, periodically, or steady-state, while the same or a different cleaning gas can be flowed from the downstream annular plenum 146 and through the downstream annular orifice 152 into the throttle valve flow channel 30 in the same or a different manner. The upstream and downstream clean gas flows can be provided simultaneously or at different times, different intervals, or different durations. For example, but not for limitation, more by-product powders may be deposited downstream of the closure member 14 than upstream, in which case it may be beneficial to provide more robust bursts or flows of cleaning gas from the downstream annular orifice 152 to dislodge and remove such downstream powder deposits, while providing a milder flow of clean gas from the upstream orifice 52 to help sweep such dislodged powder deposits through the throttle valve flow chamber 30 to the outlet 22. Of course, another example throttle valve (not shown) could be equipped with either one or the other, but not both, of: (i) the upstream duct 245, upstream annular plenum 46, and upstream annular orifice; or (ii) the downstream duct 247, downstream annular plenum 146, and downstream annular orifice 152. Persons skilled in the art will recognize other example implementations and variations, once they become familiar with the principles of applying cleaning gases in the example throttle valves described herein.

In some implementations, the cleaning gas may be a reactive gas instead of an inert or non-reactive gas. For example, a reactive gas can be flowed into the flow channel 30 through the annular nozzles 51, 151 and orifices 52, 152 in the example throttle valve 10 in FIGS. 5-7 (or one or both of the annular nozzles 51, 151 and orifices 52, 152 in the example throttle valve 210 in FIG. 10), for example, to implement chemical cleaning of the throttle valve 10 (or 210). For example, in some circumstances and conditions, certain effluents of some CVD processes can result in depositions of solid films or coatings, e.g., oxide films, in or immediately downstream from the throttle valve 10 (or 210), which cannot be cleaned or removed by either an inert, high pressure, gas jet or physical heating. A reactive gas, for example, an etch gas such as chlorine trifluoride ($ClF_3$) or hydrofluoric acid (HF), injected into the flow channel 30 through one or both of the annular nozzles 51, 151 and orifices 52, 152 as described above can turn such solid film depositions into vapor by-products, thereby keeping the throttle valve 10 (or 210) clean.

Of course, the higher the pressure of the in-flow of cleaning gas into the plenums 46, 146, the higher the velocity and stronger the force of the flow of cleaning gas out of the annular orifices 52, 152. However, an excessively high pressure may flood the vacuum system, affect the pump performance, or even impair the vacuum integrity of the system. Therefore, it is appropriate in most applications to limit the gas inlet pressure, for example, but not for limitation, to not more than 35 psig, or about 2 bar.

Also, a positive pressure and blowing powder particles could cause such particles to back-flow into the reaction chamber 102 (FIG. 1), which would subject the subsequent thin films 106 deposited in the reaction chamber 102 to particle contamination, which could ruin the thin films 106. Again, contamination in the reaction chamber 102 would be extremely costly for lost production and the time it would take to break down the system for cleaning and then re-evacuating. To prevent such contamination, the isolation valve 118 in the vacuum pumping line 104 can be closed to isolate and maintain the vacuum in the reaction chamber 102 during the Meaning gas purge or cleaning in the throttle valve 10. However, such positive pressures can also destroy the seals in the throttle valve 10 itself, in the vacuum pump 116, and in other sealed connections in the vacuum pumping line 104.

In one example implementation, the cleaning gas is supplied at a pressure which is high enough to produce choked flow condition in the annular nozzles 51, 151 leading to the respective annular orifices 52, 152, which limits the mass flow rate of the cleaning gas through the annular nozzles 51, 151 and annular orifices 52, 152. Such limited mass flow rate of the cleaning gas through the annular orifices 52, 152 into the flow channel 30 of the throttle valve 10 self-limits the downstream pressure, i.e., the pressure in the throttle valve 10 and in the vacuum pumping line 104. Therefore, complex flow control for the cleaning gas flow into the annular nozzles 51, 151 is not needed if such choked flow condition is utilized. Generally, a simple pressure regulator 136 and on/off cleaning gas control valve 134 is sufficient. Choked flow in the annular nozzles 51, 151 occurs when the pressure ratio between the outlet pressure of the annular nozzles 51, 151 at the respective annular orifices 52, 152 and the inlet pressure of the respective annular nozzles 51, 151 is less than 0.528. Typically, the vacuum pump 116 may be operated during the cleaning cycles in which the cleaning gas is pulsed or otherwise flowed through the annular orifices 52, 152 into the flow channel 30 of the throttle valve 10. Therefore, it is relatively easy to provide the upstream and downstream nozzle inserts 50, 150 with respective cylindrical extensions 70, 170 of appropriate respective dimensions, e.g., diameters, to form the respective upstream and downstream annular nozzles 51, 151 with appropriate sizes, e.g., respective cross-sectional areas, to produce the choked flow conditions in the annular nozzles 51, 151 in the vacuum parameters in which the throttle valve 10 typically operates in a CVD process with relatively small pressure parameters for the cleaning gas supply, as will be understood by persons skilled in the art, once they understand the principles and features described herein for the example throttle valve 10. For example, tests on a prototype annular nozzle showed that, with a one to two minute flow of nitrogen gas ($N_2$) from a supply pressure of 35 psi, the pressure in the throttle valve, vacuum pumping line, and vacuum pump only rose to about seven torr, which clearly indicates that choked flow condition is achieved, as the pressure ratio is significantly higher than 0.528. Yet, seven torr pressure is not enough to damage seals in the throttle valve 10 or other components of the system.

If reactive gas is flowed through the annular orifices 52, 152 to clean solid film deposition or coating in the throttle valve 10 as described above, the inlet pressure can be kept much lower, for example, slightly below ambient pressure, because, in chemically reacting a reactive gas, e.g., reacting an etch gas with a solid thin film material, velocity of the reactive gas flow out of the annular orifices 52, 152 is less important than the temperature of the reactive gas. Such a reactive gas etching or cleaning operation may be enhanced by heating the reactive gas and the throttle valve 10.

Other components, for example, another isolation valve 138 as illustrated in FIG. 1 can be provided in the cleaning gas supply line 130 cleaning to close the supply line 130 to the throttle valve 10 during times of normal operation of the CVD, if desired, or to isolate the supply line 130 in times when the throttle valve 10 may have to be removed for servicing or replacement. An optional check valve 140 can also be provided to ensure that the cleaning gas flow in the supply line 130 is only in one direction, i.e., toward the throttle valve 10.

In another implementation, the cleaning gas may be flowed from the supply line 130 into the annular plenums 46, 146 of the throttle valve 10 and out of the annular orifices 52, 152 concurrently with on-going CVD deposition operations. In such an example implementation, it may be preferable that the cleaning gas be flowed at a controlled pressure that produces annular laminar flow of the cleaning gas out of the annular orifices 52, 152 in a manner that inhibits the exhaust gas flow and powder particles in the exhaust gas flow from contacting and sticking to the inside wall surface 31 of the throttle valve 10.

In another example implementation, the CVD deposition process can be shut down for a short period of time, the isolation valve 118 can be closed to isolate the reaction chamber 102 from the vacuum pumping line 104 and components in the vacuum pumping line 104, which include the throttle valve 10 and vacuum pump 116. The flow of cleaning gas from the supply line 130 can be started by opening the control valve 132, either in pulsed bursts, in steady-state flow, or other variation as explained above, into the annular plenums 46, 146 of the throttle valve 10. That cleaning gas flow then flows through the annular orifices 52, 152 to dislodge powder particles that may be sticking to the inside surface 31 of the valve body 32, to the closure member 14, or to other internal components of the throttle valve 10 and to blow them out of the outlet 22. Performing this cleaning operation for about one to two minutes per day, for example, in a MOCVD GaN deposition operation as described above, is believed to be enough to prolong operation of the throttle valve 10 for periods of twelve to eighteen months before having to break down the CVD system and remove the throttle valve 10 from the vacuum pumping line 104 for cleaning, as compared to typical 2-month cleaning intervals required in such MOCVD GaN deposition systems without this powder control feature.

The structures and functions of the cleaning gas injection features described above are not dependent of any particular setting of the closure member or ability of the closure member to provide a throttling function. Therefore, while the example valves 10, 210 described above are throttle valve examples and the closure member 14 in those examples is described as a throttling closure member, the cleaning gas injection features described herein can be implemented in other valves, for example, but not for limitation, in an on/off valve (not shown) in which the closure member is movable between an open position and a closed position with no settings or adjustments between the open and closed positions.

The foregoing description provides examples that illustrate the principles of the invention, which is defined by the features that follow. Since numerous insignificant modifications and changes will readily occur to those skilled in the art once they understand the invention, it is not desired to limit the invention to the exact example constructions and processes shown and described above. Accordingly, resort may be made to all suitable combinations, subcombinations, modifications, and equivalents that fall within the scope of the invention as defined by the features. The words "comprise," "comprises," "comprising," "include," "including," and "includes" when used in this specification, including the features, are intended to specify the presence of stated features, integers, components, or steps, but they do not preclude the presence or addition of one or more other features, integers, components, steps, or groups thereof.

The invention and several embodiments in which an exclusive property or privilege is claimed are defined as follows:

1. Valve apparatus, comprising:
    a valve body that has a flow channel with a closure member positioned between an inlet end and an outlet end of the flow channel in the valve body;
    a nozzle insert in the flow channel that forms an annular orifice in the flow channel;
    an annular plenum around the nozzle insert in fluid flow communication with the annular orifice; and
    an auxiliary port connected in fluid flow relation to the annular plenum.

2. The valve apparatus of claim 1, wherein the annular plenum comprises an annular channel extending into the inlet end of the valve body, and wherein the annular channel is enclosed by the nozzle insert to form the annular plenum.

3. The valve apparatus of claim 2, wherein the nozzle insert has a flared inlet end section that converges to a cylindrical extension which is smaller in diameter than the inside wall of the valve body that forms the flow channel.

4. The valve apparatus of claim 3, wherein the cylindrical extension extends into the flow channel farther than the annular channel to form an annular nozzle between the inside wall surface and the cylindrical extension such that said annular nozzle extends from the annular plenum to the annular orifice.

5. The valve apparatus of claim 4, including a rim flange around the periphery of the flared inlet end section that abuts the valve body adjacent to the annular channel.

6. The valve apparatus of statement 5, including a circular seal mounted on the rim flange.

7. The valve apparatus of claim 1, wherein the annular plenum comprises an annular channel extending into the outlet end of the valve body, and wherein the annular channel is enclosed by the nozzle insert to form the annular plenum.

8. Throttle valve apparatus for throttling a flow of effluent gas in a vacuum pumping line of a CVD system that produces powder particles in the effluent, comprising:
a valve body with a flow channel that is defined by an inside wall surface of the valve body and that extends along a longitudinal axis from an inlet port to an outlet port;
a throttling closure member positioned in the flow channel between the inlet port and the outlet port;
an annular orifice adjacent to the inside wall surface facing toward the throttling closure member;
an annular plenum in the valve body connected in fluid flow relation to the annular orifice by an annular nozzle which is oriented to inject an annular flow of cleaning gas through the annular orifice and into the flow channel along the inside wall surface of the valve body parallel to and concentric with longitudinal axis and toward the throttling closure member;
an auxiliary duct in the valve body in fluid flow relation to the annular plenum and adapted for connection to a source of cleaning gas.

9. The throttle valve apparatus of claim 8, including a cleaning gas supply valve connected in fluid flow relation to the auxiliary port for controlling a flow of cleaning gas into the auxiliary port.

10. A method of controlling powder and solid deposition in a throttle valve that has a valve body with a flow channel defined by an inside wall surface of the valve body and that extends along a longitudinal axis between an inlet port and an outlet port of the valve body, and a closure member in the flow channel, comprising:
directing two annular flows of cleaning gas toward each other in opposite directions from opposite sides of the closure member along the inside wall surface paralleled to and concentric with the longitudinal axis.

11. A method of controlling powder and solid deposition in a throttle valve that ha valve body with a flow channel defined by an inside wall surface of the valve body between an inlet port and an outlet port of the valve body, and a closure member in the flow channel, comprising:
flowing a first portion of a cleaning gas through an upstream annular nozzle positioned adjacent to the inside wall surface upstream from the closure member and directed along the inside wall surface toward the closure member; and
flowing a second portion of the cleaning gas through a downstream annular nozzle positioned adjacent to the inside wall surface downstream from the closure member and directed along the inside wall surface toward the closure member.

12. The method of claim 11, including:
flowing the first portion of the cleaning gas into an upstream annular plenum for distribution to the upstream annular nozzle; and
flowing the second portion of the cleaning gas into a downstream annular plenum for distribution to the downstream annular nozzle.

13. The method of claim 12, including:
flowing the first portion of the cleaning gas from the upstream annular plenum through an upstream annular nozzle to the upstream annular orifice; and
flowing the second portion of the cleaning gas from the downstream annular plenum through a downstream annular nozzle to the downstream annular orifice.

14. The method of claim 13, including:
producing a choked flow condition in the upstream annular nozzle; and
producing a choked flow condition in the downstream annular nozzle.

15. The method of claim 11, including directing the two annular flows of cleaning gas intermittently in opposite directions from opposite sides of the closure member toward each other along the inside wall surface.

16. The method of claim 11, including directing the two annular flows of cleaning gas in pulsed flows in opposite directions from opposite sides of the closure member toward each other along the inside wall surface.

17. The method of claim 11, including directing the two annular flows of cleaning gas in steady-state flows in opposite directions from opposite sides of the closure member toward each other along the inside wall surface.

18. The method of claim 11, wherein the cleaning gas is a non-reactive gas.

19. The method of claim 11, wherein the cleaning gas is a reactive gas.

20. The method of claim 11, including moving the closure member back and forth between the opened and closed positions in the flow channel while directing the two annular flows of cleaning gas in opposite directions from opposite sides of the closure member toward each other along the inside wall surface.

21. A method of controlling powder and solid deposition in a valve that has a valve body and that extends along longitudinal axis with a flow channel defined by an inside wall surface of the valve body between an inlet port and an outlet port of the valve body, and a closure member in the flow channel, comprising:
directing at least one annular flow of cleaning gas into the flow chamber along the inside wall surface toward the closure member parallel to and concentric with longitudinal axis.

22. The method of claim 21, including directing the annular flow of cleaning gas into the flow chamber by flowing the cleaning gas through at least one annular nozzle positioned adjacent to the inside wall surface of the valve body and oriented to inject the cleaning gas along the inside wall surface toward the closure member in an annular jet flow that is parallel to and concentric with a longitudinal axis of the flow chamber.

23. The method of claim 22, including flowing the cleaning gas into an annular plenum for distribution to the annular nozzle.

24. The method of claim 23, including flowing the cleaning gas through the annular nozzle and out of an annular orifice positioned upstream of the closure member.

25. The method of claim 23, including flowing the cleaning gas through the annular nozzle and out of an annular orifice positioned downstream of the closure member.

26. The method of claim 23, including producing a choked flow condition in the annular nozzle.

27. The method of claim 21, including directing two annular flows of cleaning gas in opposite directions from opposite sides of the closure member toward each other along the inside wall surface.

28. The method of claim 21, wherein the cleaning gas is a non-reactive gas.

29. The method of claim 21, wherein the cleaning gas is a reactive gas.

30. The method of claim 21, including moving the closure member back and forth between the opened and closed positions in the flow channel while directing the at least one annular flow of cleaning gas into the flow chamber along the inside wall surface toward the closure member.

31. Valve apparatus that has a valve body with a flow channel defined by an inside wall surface of the valve body and that extends along a longitudinal axis between an inlet port and an outlet port of the valve body, and a closure member in the flow channel, characterized by means for directing two annular flows of cleaning gas toward each other in opposite directions from opposite sides of the closure member along the inside wall surface parallel to and concentric with longitudinal axis.

32. Valve apparatus that has a valve body with a flow channel defined by an inside wall surface of the valve between an inlet port and an outlet port of the valve body, and a closure member in the flow channel, comprising:

an upstream annular nozzle positioned adjacent to the inside wall surface upstream from the closure member and directed along the inside wall surface toward the closure member; and a downstream annular nozzle positioned adjacent to the inside wall surface downstream from the closure member and directed along the inside wall surface toward the closure member.

33. The valve apparatus of claim 32, including:

an upstream annular plenum for distributing a first portion of the cleaning gas to the upstream annular nozzle; and a downstream annular plenum far distributing a second portion of the cleaning gas to the downstream annular nozzle.

34. The valve apparatus of claim 33, including:

an upstream annular nozzle extending between the upstream annular plenum to the upstream annular orifice for flowing the first portion of the cleaning gas from the upstream annular plenum to the upstream annular orifice; and a downstream annular nozzle extending between the downstream annular plenum to the downstream annular nozzle for flowing the second portion of the cleaning gas from the downstream annular plenum to the downstream annular orifice.

35. The valve apparatus of claim 34, wherein:

the upstream annular nozzle has a cross-sectional area that is sized to produce a choked flow condition in the upstream annular nozzle in vacuum parameters in which the valve is operated and pressure parameters in which the cleaning gas is supplied; and the downstream annular nozzle has a cross-sectional area that is sized to produce a choked flow condition in the downstream annular nozzle in the vacuum parameters in which the valve is operated and the pressure parameters in which the cleaning gas is supplied.

* * * * *